United States Patent [19]

Kato

[11] Patent Number: 5,670,910
[45] Date of Patent: Sep. 23, 1997

[54] OPERATIONAL AMPLIFIER FREE FROM DISPERSION IN QUIESCENT CURRENT CONSUMED BY OUTPUT STAGE

[75] Inventor: Fumihiko Kato, Tokyo, Japan

[73] Assignee: NEC Corporation, Tokyo, Japan

[21] Appl. No.: 592,735

[22] Filed: Jan. 26, 1996

[30] Foreign Application Priority Data

Jan. 27, 1995 [JP] Japan .................................. 7-031351

[51] Int. Cl.$^6$ ............................................. H03F 3/45
[52] U.S. Cl. ......................... 330/253; 330/255; 330/257
[58] Field of Search ............................. 330/253, 255, 330/257

[56] References Cited

U.S. PATENT DOCUMENTS 4,829,266  5/1989  Pernici et al. .................. 330/257 X

FOREIGN PATENT DOCUMENTS 4-076246  12/1992  Japan .

OTHER PUBLICATIONS

J. Kih et al., "Class–AB Large–Swing CMOS Buffer Amplifier with Controlled Bias Current", *IEEE Journal of Solid-State Circuits* 28(12): 1350–1353 (1993).

S. Pernici et al., "A CMOS Low–Distortion Fully Differential Power Amplifier with Double Nested Miller Compensation", *IEEE Journal of Solid–State Circuits* 28(7): 758–763 (1993).

Primary Examiner—James B. Mullins
Attorney, Agent, or Firm—Foley & Lardner

[57] ABSTRACT

An input stage, an error compensable level-shift stage and an output stage form in combination an operational amplifier circuit, and the error compensating level-shift stage includes an inverting transistor coupled to an input node of a current mirror circuit and responsive to an output potential level of the input stage for controlling an output potential level of the current mirror circuit and a constant current source coupled to the output node of the current mirror circuit so as to eliminate influence of unintentional variation of the channel doping level of the inverting transistor from the output potential level at the output node.

14 Claims, 9 Drawing Sheets

OPERATIONAL AMPLIFIER FREE FROM DISPERSION IN QUIESCENT CURRENT CONSUMED BY OUTPUT STAGE

FIELD OF THE INVENTION

This invention relates to an operational amplifier and, more particularly, to an operational amplifier circuit constant in the quiescent current passing through an output stage.

DESCRIPTION OF THE RELATED ART

A typical example of the operational amplifier circuit is incorporated in a differential amplifier circuit disclosed in Japanese Patent Publication of Examined Application No. 4-76246, and the prior art operational amplifier circuit serves as an input stage of the prior art differential amplifier.

FIG. 1 illustrates the prior art operational amplifier circuit, and input terminals IN1 and IN2, an output terminal OUT1 and high and low power supply lines VH1 and VL1 are associated with the prior art operational amplifier circuit.

The prior art operational amplifier comprises a pair of n-channel enhancement type field effect transistors M1/M2 and a pair of p-channel enhancement type field effect transistors M3/M4, and the pair of p-channel enhancement type field effect transistors M3/M4 and the pair of n-channel enhancement type field effect transistors M1/M2 are referred to as "first differential pair" and "second differential pair" in Japanese Patent Publication of Examined Application No. 4-76246. The input terminals IN1 and IN2 are coupled to the gate electrodes of the field effect transistors M1 and M3 and the gate electrodes of the field effect transistors M2 and M4, respectively.

The prior art operational amplifier circuit further comprises a first constant current source I1 and a second constant current source I2. The first constant current source I1 is coupled between the source nodes of the n-channel enhancement type field effect transistors M1 and M2 and the low power supply line VL1, and the second constant current source I2 is coupled between the high power supply line VH1 and the source nodes of the p-channel enhancement type field effect transistors M3 and M4.

The prior art operational amplifier circuit further comprises a first current mirror circuit MR1 and a second current mirror circuit MR2, and the first current mirror circuit MR1 and the second current mirror circuit MR2 are respectively implemented by a parallel combination of p-channel enhancement type field effect transistors M5/M6 and a parallel combination of p-channel enhancement type field effect transistors M7/M8, respectively.

The p-channel enhancement type field effect transistor M5 is connected at the source node to the high power supply line VH1 and at the drain node to the drain node of the n-channel enhancement type field effect transistor M1, and the other p-channel enhancement type field effect transistor M6 is connected at the source node to the high power supply line VH1 and at the drain node to the drain node of the p-channel enhancement type field effect transistor M4. The gate electrodes of the p-channel enhancement type field effect transistors M5 and M6 are commonly connected to the drain node of the n-channel enhancement type field effect transistor M1.

On the other hand, the p-channel enhancement type field effect transistor M7 is connected at the source node to the high power supply line VH1 and at the drain node to the drain node of the n-channel enhancement type field effect transistor M2, and the other p-channel enhancement type field effect transistor M8 is connected at the source node to the high power supply line VH1 and at the drain node to the drain node DN1 of the p-channel enhancement type field effect transistor M3. The gate electrodes of the p-channel enhancement type field effect transistors M7 and M8 are commonly connected to the drain node of the n-channel enhancement type field effect transistor M2.

The pair of n-channel enhancement type field effect transistors M1 and M2 are arranged in parallel to the pair of p-channel enhancement type field effect transistors M3 and M4 through the first and second current mirror circuits MR1 and MR, and widen the input potential range.

A potential difference between the input terminals IN1 an IN2 is converted to a potential level at the drain node DN1 of the p-channel enhancement type field effect transistor M3, and the potential level is varied with respect to the high power voltage on the power supply line VH1.

The prior art operational amplifier circuit further comprises a level-shift stage LV1, and the level-shift stage LV1 is implemented by a series of a third constant current source I3 and a p-channel enhancement type field effect transistor M9 coupled between the high power supply line VH1 and the low power supply line VL1. The gate electrode of the p-channel enhancement type field effect transistor M9 is connected to the drain node DN1 of the p-channel enhancement type field effect transistor M3.

The prior art operational amplifier circuit further comprises an output buffer stage BF1, and the output buffer stage BF1 is implemented by a series of a p-channel enhancement type field effect transistor M10 and an n-channel enhancement type field effect transistor M11. The series of field effect transistors M10 and M11 is coupled between the high power supply line VH1 and the low power supply line VL1, and the output terminal OUT1 is coupled to the common drain node of the field effect transistors M10 and M11. The gate electrode of the p-channel enhancement type field effect transistor M10 is connected to the source node SN1 of the p-channel enhancement type field effect transistor M9, and the gate electrode of the n-channel enhancement type field effect transistor M11 is connected to the drain node DN1 of the p-channel enhancement type field effect transistor M3.

The level-shift stage LV1 changes the potential range at the drain node DN1 of the p-channel enhancement type field effect transistor M3 to a different potential range at the source node SN1 of the p-channel enhancement type field effect transistor M9. The p-channel enhancement type field effect transistor M10 and the n-channel enhancement type field effect transistor M11 are controlled by using the potential level at the drain node DN1 and the potential level at the source node SN1, and promptly raises or decays the potential level at the output terminal OUT1.

The prior art operational amplifier circuit further comprises a third current mirror circuit MR3 implemented by n-channel enhancement type field effect transistors M12 and M13. The n-channel enhancement type field effect transistors M12 and M13 are coupled in parallel between the drain nodes DN1 and DN2 of the p-channel enhancement type field effect transistors M3 and M4 and the low power supply line VL1, and the gate electrodes of the n-channel enhancement type field effect transistors M12 and M13 are coupled to the drain node DN2.

Assuming now that the potential level at the input terminal IN1 becomes higher than the potential level at the other input terminal IN2, the high potential level at the input terminal IN1 increases the channel conductance of the n-channel enhancement type field effect transistor M1, and decreases the channel conductance of the p-channel enhancement type field effect transistor M3.

On the other hand, the low potential level at the input terminal IN2 decreases the channel conductance of the n-channel enhancement type field effect transistor M2, and increases the channel conductance of the p-channel enhancement type field effect transistor M4.

As a result, the potential level at the drain node DN3 is lowered, and the potential level at the drain node DN4 is raised. The first current mirror circuit MR1 increases the current supplied to the drain nodes DN2 and DN3, and the second current mirror circuit MR2 decreases the current supplied to the drain nodes DN4 and DN1.

The increased current raises the potential level at the drain node DN2, and the third current mirror circuit MR3 increases the channel conductances of the n-channel enhancement type field effect transistors M12 and M13. Moreover, the second current mirror circuit MR2 decreases the current supplied to the drain node DN1, and the high potential level at the input node IN1 decreases the channel conductance of the p-channel enhancement type field effect transistor M3. As a result, the potential level at the drain node DN1 is lowered.

The lowered potential level at the drain node DN1 increases the channel conductance of the p-channel enhancement type field effect transistor M9, and the p-channel enhancement type field effect transistor M9 lowers the potential level at the source node SN1. Thus, the potential levels at both of the drain node DN1 and the source node SN1 are decayed in the respective potential ranges different from each other.

The lowered potential level at the drain node DN1 decreases the channel conductance of the n-channel enhancement type field effect transistor M11, and the lowered potential level at the source node SN1 increases the channel conductance of the p-channel enhancement type field effect transistor M10. As a result, the output buffer stage BF1 raises the potential level at the output terminal OUT1.

The potential level at the output terminal OUT1 rises to a high level lower than the high power voltage by the source-to-drain voltage of the p-channel enhancement type field effect transistor M10, and is decayed to a low level higher than the low power voltage by the source-to-drain voltage of the n-channel enhancement type field effect transistor M11. As a result, the output buffer stage BF1 swings the potential level at the output terminal OUT1 in the wide range.

However, the prior art operational amplifier circuit encounters a problem in that the quiescent current passing though the output buffer stage BF1 is not constant among products. In detail, while the prior art operational amplifier circuit is being integrated on a semiconductor substrate, a p-type dopant impurity and an n-type dopant impurity are selectively introduced into the channel regions of the component field effect transistors M1 to M13, and regulate the threshold levels thereof. However, it is impossible to strictly control the amount of the dopant impurity introduced into the channel regions, and, accordingly, the thresholds of the component field effect transistors tend to slightly fluctuate. The p-channel enhancement type field effect transistor M9 is also affected by the fluctuation, and the threshold is dispersed among the products. The dispersion of the threshold level results in the difference of the potential level at the source node SN1, and the p-channel enhancement type field effect transistor M10 varies the channel conductance depending upon the potential level at the source node SN1.

Thus, the dispersion of the channel doping level affects the channel conductance of the p-channel enhancement type field effect transistor M10, and changes the quiescent current passing though the output stage BF1.

SUMMARY OF THE INVENTION

It is therefore an important object of the present invention to provide an operational amplifier circuit which is strictly constant in a quiescent current consumed by an output stage.

To accomplish the object, the present invention proposes to take up a potential variation due to a fluctuation of a threshold of an inverting transistor by using a constant current source with a large resistance.

In accordance with the present invention, there is provided an operational amplifier circuit comprising: an input stage connected to first and second input nodes, and producing a first potential level variable with the magnitude of an input potential difference between the first and second input nodes at a first output node thereof; an error compensable level-shift stage including an inverting transistor having a control node coupled to the first output node of the input stage for producing a second potential level complementarily varied with the first potential level at an intermediate node thereof, a first current mirror circuit having a first current mirror transistor coupled in series to the inverting transistor and a second current mirror transistor coupled in parallel to the first current mirror transistor, the first and second current mirror transistors having respective control nodes coupled to the intermediate node for producing a third potential level at a second output node thereof, a first constant current source coupled through the second output node to the second current mirror transistor; and an output stage including a first output transistor coupled to a first power voltage source and having a control node coupled to the second output node for varying an on-resistance thereof, a second output transistor coupled between the first output transistor and a second power voltage source different in power voltage level from the first power voltage source and having a control node coupled to the first output node for complementarily changing an on-resistance with respect to the on-resistance of the first output transistor, and a third output node provided between the first output transistor and the second output transistor for producing an output potential signal corresponding to the input potential difference.

BRIEF DESCRIPTION OF THE DRAWINGS

The features and advantages of the operational amplifier circuit according to the present invention will be more clearly understood from the following description taken in conjunction with the accompanying drawings in which.

DESCRIPTION OF THE PREFERRED EMBODIMENTS

First Embodiment

Figure 1:
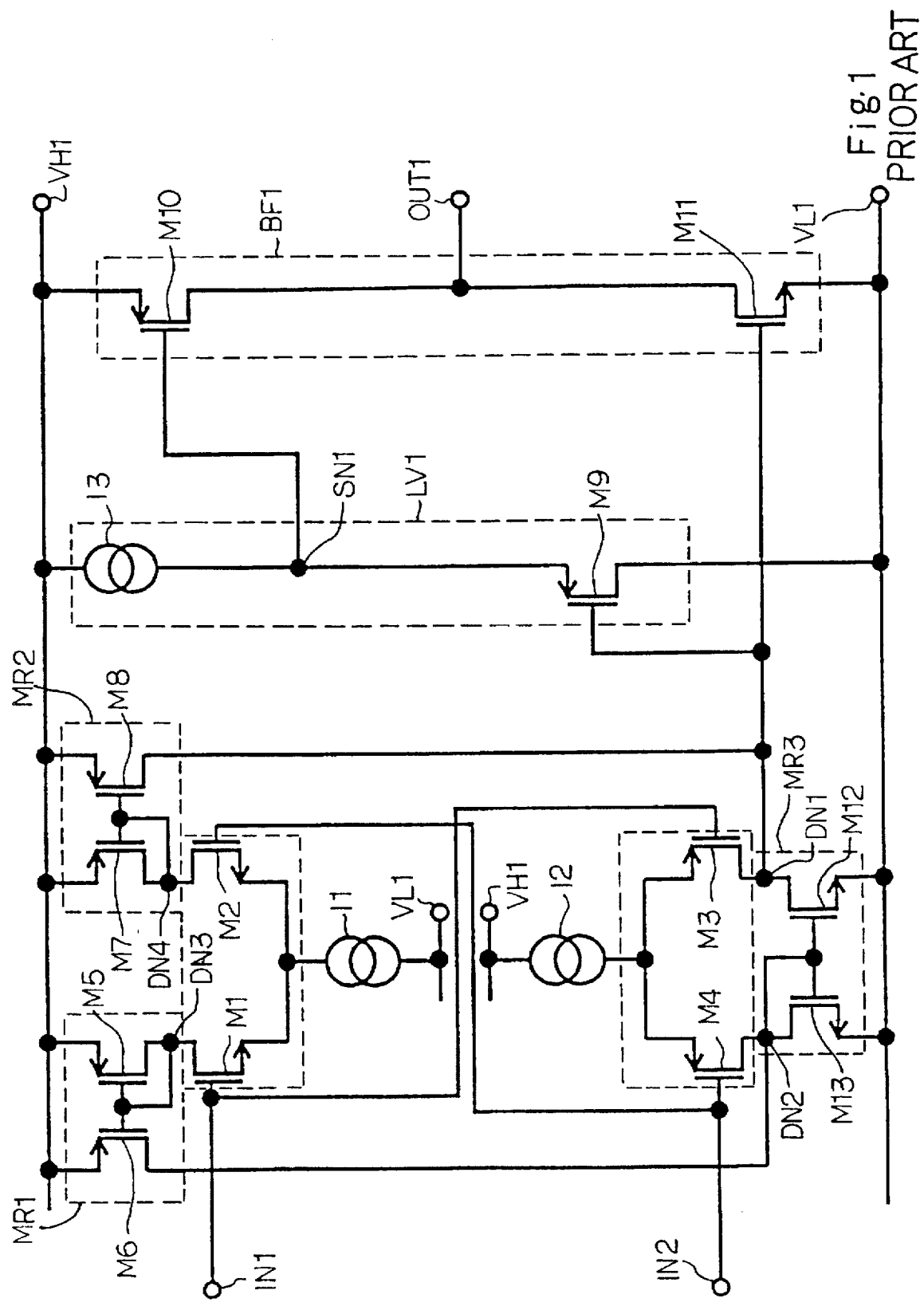
FIG. 1 is a circuit diagram showing the arrangement of the prior art operational amplifier circuit.
Figure 2:
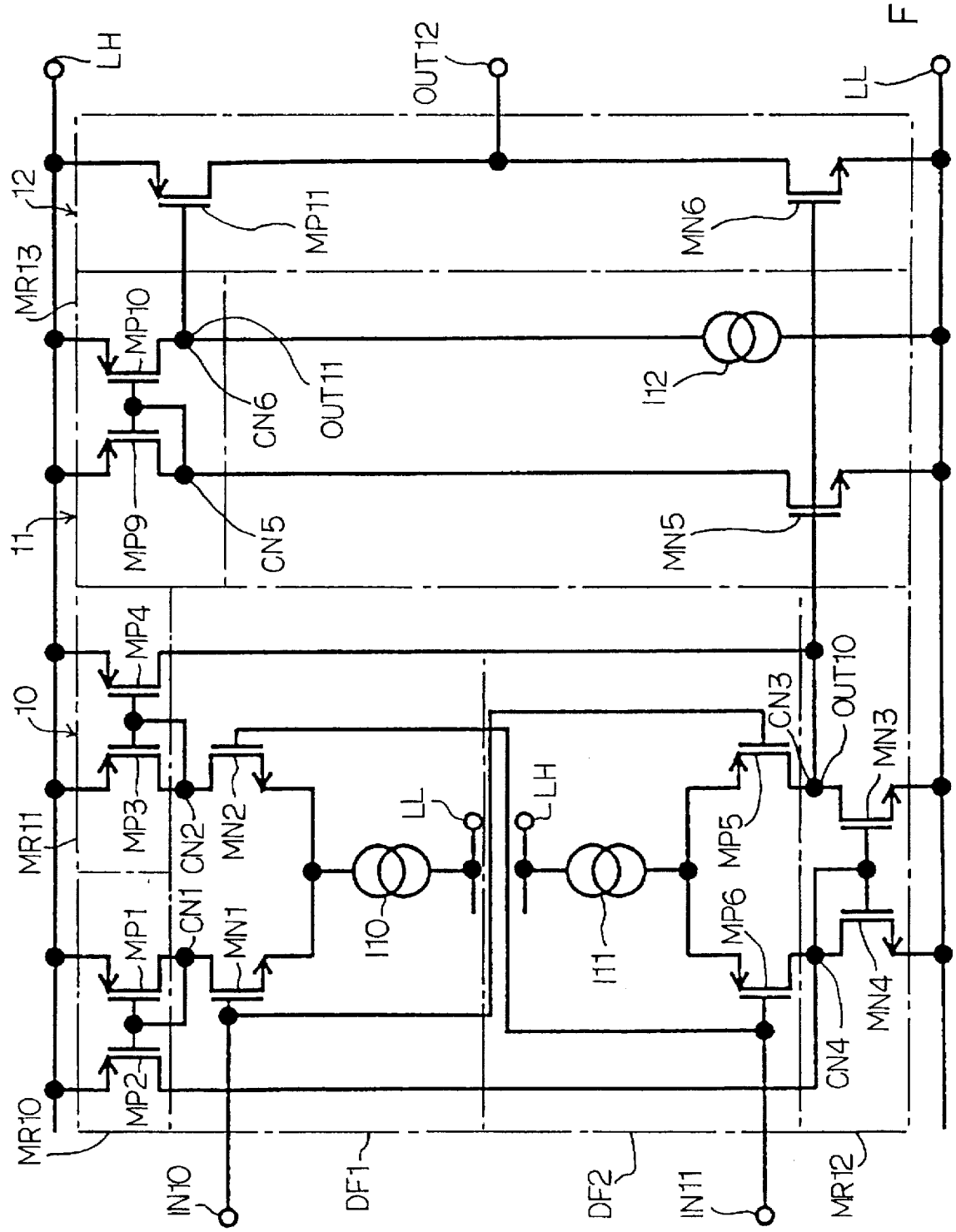
FIG. 2 is a circuit diagram showing the arrangement of a first operational amplifier circuit according to the present invention.

Referring to FIG. 2 of the drawings, an operational amplifier circuit embodying the present invention largely comprises an input stage 10, an error compensable level-shift stage 11 and an output stage 12, and the input stage 10, the error compensable level-shift stage 11 and the output stage 12 are coupled in parallel between two different power supply lines LH and LL. The power supply line LH and the power supply line LL supply a high power voltage Vh and a low power voltage V1 to the input stage 10, the error compensable level-shift stage 11 and the output stage 12.

A pair of input nodes IN10/IN11 is associated with the input stage 10, and the input stage 10 converts an input potential difference between the input nodes IN10/IN11 to a potential level at an output node OUT10 of the input stage 10 variable in dependence on the input potential difference.

The input stage 10 includes a first current mirror circuit MR10 and a second current mirror circuit MR11 coupled in parallel to the power supply line LH and a first differential circuit DF1 coupled between the first and second current mirror circuits MR10/MR11 and the power supply line LL.

A parallel combination of n-channel enhancement type field effect transistors MN1 and MN2 and a constant current source I10 form in combination the first differential circuit DF1, and the input nodes IN10 and IN11 are respectively connected to the gate electrodes of the n-channel enhancement type field effect transistors MN1 and MN2. The common source node of the n-channel enhancement type field effect transistors MN1 and MN2 is connected to the constant current source I10, and current is discharged through the constant current source I10 to the power supply line LL. The drain nodes of the n-channel enhancement type field effect transistors MN1 and MN2 serve as current input nodes CN1 and CN2, and the first constant current source I10 regulates the total amount of currents passing through the current input nodes CN1 and CN2 to a constant value. Therefore, the n-channel enhancement type field effect transistors MN1 and MN2 complementarily change the currents passing therethrough depending upon the potential difference between the input nodes IN10 and IN11.

The first current mirror circuit MR10 is implemented by a pair of p-channel enhancement type field effect transistors MP1/MP2 coupled in parallel to the power supply line LH, and the gate electrodes of the p-channel enhancement type field effect transistors MP1 and MP2 are coupled to the current input node CN1. Therefore, the potential level at the current input node CN1 similarly affects the channel conductances of the p-channel enhancement type field effect transistors MP1 and MP2, and concurrently changes the amount of current passing through the p-channel enhancement type field effect transistor MP1 and the amount of current passing through the p-channel enhancement type field effect transistor MP2.

The second current mirror circuit MR11 is also implemented by a pair of p-channel enhancement type field effect transistors MP3/MP4 coupled in parallel to the power supply line LH, and the gate electrodes of the p-channel enhancement type field effect transistors MP3 and MP4 are coupled to the current input node CN2. Therefore, the potential level at the current input node CN2 similarly affects the channel conductances of the p-channel enhancement type field effect transistors MP3 and MP4, and concurrently changes the amount of current passing through the p-channel enhancement type field effect transistor MP3 and the amount of current passing through the p-channel enhancement type field effect transistor MP4.

The input stage 10 further includes a second differential circuit DF2 coupled to the power supply line LH and a third current mirror circuit MR12 coupled between the second differential circuit DF2 and the power supply line LL.

A constant current source I11 and a parallel combination of p-channel enhancement type field effect transistors MP5 and MP6 form in combination the second differential circuit DF2, and the input nodes IN10 and IN11 are respectively connected to the gate electrodes of the p-channel enhancement type field effect transistors MP5 and MP6. The common source node of the p-channel enhancement type field effect transistor MP5 and MP6 is connected to the constant current source I11, and current is supplied through the constant current source I11 to the p-channel enhancement type field effect transistors MP5 and MP6. The drain nodes of the p-channel enhancement type field effect transistors MP5 and MP6 serve as current output nodes CN3 and CN4, and the current output node CN3 further serves as the output node OUT10 of the input stage 10. The second constant current source I11 regulates the total amount of currents flowing into the p-channel enhancement type field effect transistors MP5 and MP6 and, accordingly, the current output nodes CN3 and CN4 to a constant value. Therefore, the p-channel enhancement type field effect transistors MP5 and MP6 complementarily change the currents passing therethrough depending upon the potential difference between the input nodes IN10 and IN11.

The third current mirror circuit MR12 is implemented by a pair of n-channel enhancement type field effect transistors MN3/MN4 coupled in parallel to the power supply line LL, and the gate electrodes of the n-channel enhancement type field effect transistors MN3 and MN4 are coupled to the current output node CN4. Therefore, the potential level at the current output node CN4 similarly affects the channel conductances of the n-channel enhancement type field effect transistors MN3 and MN4, and concurrently changes the amount of current passing through the n-channel enhancement type field effect transistor MN3 and the amount of current passing through the n-channel enhancement type field effect transistor MN4. The third current mirror circuit MR12 serves as an active load.

The drain nodes of the p-channel enhancement type field effect transistors MP2 and MP4 are coupled to the current output nodes CN4 and CN3, and supplies the currents equal to the currents flowing into the current input nodes CN1/CN2 to the current output nodes CN3/CN4. Thus, the first and second current mirror circuits MR10 and MR11 links the potential levels at the current input nodes CN1/CN2 with the potential level at the current output nodes CN3/CN4, and widely swings the potential level at the output node OUT10 in cooperation with the third current mirror circuit MR12.

The error compensable level-shift stage 11 includes a fourth current mirror circuit MR13 coupled to the power supply line LH, a third constant current source I12 coupled between the fourth current mirror circuit MR13 and the power supply line LL and an n-channel enhancement type field effect transistor MN5 coupled between the fourth current mirror circuit MR13 and the power supply line LL.

The fourth current mirror circuit MR13 is implemented by a parallel combination of p-channel enhancement type field effect transistors MP9 and MP10, and the drain nodes of the p-channel enhancement type field effect transistors MP9 and MP10 serve as current output nodes CN5 and CN6. The current output node CN5 is coupled to the gate electrodes of the p-channel enhancement type field effect transistors MP9 and MP10, and the p-channel enhancement type field effect transistors MP9 and MP10 concurrently changes the channel conductances depending upon the potential level at the current output node CN5. The other current output node CN6 serves as an output node OUT11 of the error compensable level-shift stage 11.

The output stage 12 includes a p-channel enhancement type field effect transistor MP11 coupled to the power supply line LH and an n-channel enhancement type field effect transistor MN6 coupled between the p-channel enhancement type field effect transistor MP11 and the power supply line LL. The gate electrode of the p-channel enhancement type field effect transistor MP11 is coupled to the output node OUT11, and the output node OUT10 is connected to the gate electrode of the n-channel enhancement type field effect transistor MN6. The common drain node of the field effect transistors MP11 and MN6 serves as an output node OUT12 of the operational amplifier circuit.

The input stage 10 and the error compensable level-shift stage 11 respectively control the n-channel enhancement type field effect transistor MN6 and the p-channel enhancement type field effect transistor MP11, and the output stage 12 widely swings the potential level at the output node OUT12.

Description is hereinbelow made on the influence of fluctuation in channel doping of the n-channel enhancement type field effect transistor MN5 on quiescent current passing through the output stage 12. First, the quiescent current Iprt of the prior art output stage BF1 is given by Equation 1.

$$Iprt = [\{Vdd - VT - \sqrt{I3/B9(W11/L11)}\}/\{1/\sqrt{B10(W10/L10)} + 1/\sqrt{B11(W11/L11)}\}]^2 \quad \text{Equation 1}$$

where VT is (Vt9+Vt10+Vt11), Vt9 to Vt11 are the thresholds of the field effect transistors M9, M10 and M11, B9, B10 and B11 are the products of the carrier mobility (mu) and the thicknesses (Cox) of the gate oxide layers of the transistors M9 to M11, W9, W10 and W11 are channel widths of the transistors M9 to M11, L9, L10 and L11 are channel lengths of the transistors M9 to M11. Vdd is the potential level on the high voltage line VH1 and I3 is the current flowing out from the constant current source I3. Thus, equation 1 contains VT variable with the channel doping levels of the transistors M9 to M11, and the fluctuation of the channel doping affects the quiescent current Iprt.

On the other hand, the quiescent current Ix of the output stage 12 is not affected by the fluctuation of channel doping. In detail, the current passing through the transistor MP10 is equal to the amount of current I12 passing through the constant current source I12, and the current I9 passing through the transistor MP9 is given by equation 1.

$$I9=(W9/L9)/(W10/L10)\times I12 \quad \text{Equation 2}$$

where W9 and W10 are channel widths of the p-channel enhancement type field effect transistors MP9 and MP10 and L9 and L10 are channel lengths of the p-channel enhancement type field effect transistors MP9 and MP10.

The current I5 passing through the transistor MN5 is equal to the current I9. The potential level at the output node OUT10 is commonly supplied to the gate electrodes of the n-channel enhancement type field effect transistors MN5 and MN6, and the current I6 passing through the transistor MN6 is given by equation 3.

$$I6=(W6/L6)/(W5/L5)\times I9 \quad \text{Equation 3}$$

where W6 and L6 are the channel width and the channel length of the n-channel enhancement type field effect transistor MN5 and W5 and L5 are the channel width and the channel length of the n-channel enhancement type field effect transistor MN6. The current I6 is equivalent to the quiescent current Ix. From equations 2 and 3, we obtain equation 4.

$$Ix=I6=(W6/L6)/(W5/L5)\times(W9/L9)/(W10/L10) \quad \text{Equation 4}$$

Equation 4 does not contain any threshold of the component transistors, and the quiescent current Ix is determined by the channel dimensions of the transistors MP9, MP10, MN5 and MN6. For this reason, even if the fluctuation takes place in the channel doping, the quiescent current is constant.

The operational amplifier circuit behaves as follows. When the input potential level at the input node IN10 becomes higher than the input potential level at the other input node IN11, the high potential level at the input terminal IN10 increases the channel conductance of the n-channel enhancement type field effect transistor MN1, and decreases the channel conductance of the p-channel enhancement type field effect transistor MP5.

On the other hand, the low potential level at the input terminal IN11 decreases the channel conductance of the n-channel enhancement type field effect transistor MN2, and increases the channel conductance of the p-channel enhancement type field effect transistor MP6.

As a result, the potential level at the current input node CN1 is lowered, and the potential level at the current input node CN2 is raised. The first current mirror circuit MR10 increases the currents supplied to the current input node CN1 and the current output node CN4, and the second current mirror circuit MR11 decreases the currents supplied to the current input node CN2 and the current output node CN3.

The increased channel conductance of the p-channel enhancement type field effect transistor MP6 and the increased current supplied form the first current mirror circuit MR10 raise the potential level at the current output node CN4, and the increased potential level at the current output node CN4 increases the channel conductances of the n-channel enhancement type field effect transistors MN3 and MN4.

On the other hand, the second current mirror circuit MR11 decreases the current supplied to the current output node CN3, and the high potential level at the input node IN10 decreases the channel conductance of the p-channel enhancement type field effect transistor MP5. This means that the potential level at the current output node CN3 is decayed. Moreover, the increased channel conductance of the n-channel enhancement type field effect transistor MN3 further pulls down the potential level at the current output node CN3. Thus, the input stage 10 widely pulls down the potential level at the output node OUT10.

The lowered potential level at the output node OUT10 decreases the channel conductances of the n-channel enhancement type field effect transistors MN5 and MN6. The n-channel enhancement type field effect transistor MN5 raises the potential level at the current output node CN5, and the increased potential level at the current output node CN5 decrease the channel conductances of the p-channel enhancement type field effect transistors MP9 and MP10. The p-channel enhancement type field effect transistor MP10 pulls down the potential level at the output node OUT11, and the p-channel enhancement type field effect transistor MP11 increases the channel conductance.

The lowered potential level at the output node OUT10 causes the n-channel enhancement type field effect transistor MN6 to turn off, and the p-channel enhancement type field effect transistor MP11 supplies a large amount of current to the output node OUT12. The large amount of current raises the potential level at the output node OUT12.

The amount of quiescent current is determined by a ratio of transistor size between the p-channel enhancement type field effect transistors MP9 and MP10, a ratio of the transistor size between the n-channel enhancement type field effect transistors MN5 and MN6 and the third constant current source I12.

If, on the other hand, the potential level at the input node IN10 becomes lower than the potential level at the input node IN11, the low potential level at the input terminal IN10 decreases the channel conductance of the n-channel enhancement type field effect transistor MN1, and increases the channel conductance of the p-channel enhancement type field effect transistor MP5.

On the other hand, the high potential level at the input terminal IN11 increases the channel conductance of the n-channel enhancement type field effect transistor MN2, and decreases the channel conductance of the p-channel enhancement type field effect transistor MP6.

As a result, the n-channel enhancement type field effect transistor MN1 pulls up the potential level at the current input node CN1, and the n-channel enhancement type field effect transistor MN2 pulls down the potential level at the current input node CN2. The first current mirror circuit MR10 decreases the currents supplied to the current input node CN1 and the current output node CN4, and the second current mirror circuit MR11 increases the currents supplied to the current input node CN2 and the current output node CN3.

The decreased channel conductance of the p-channel enhancement type field effect transistor MP6 and the decreased current supplied form the first current mirror circuit MR10 lower the potential level at the current output node CN4, and the potential level at the current output node CN4 decreases the channel conductances of the n-channel enhancement type field effect transistors MN3 and MN4.

On the other hand, the second current mirror circuit MR11 increases the current supplied to the current output node CN3, and the low potential level at the input node IN10 increases the channel conductance of the p-channel enhancement type field effect transistor MP5. This means that the current output node CN3 raises the potential level. Moreover, the decreased channel conductance of the n-channel enhancement type field effect transistor MN3 further pulls up the potential level at the current output node CN3. Thus, the input stage 10 widely pulls up the potential level at the output node OUT10.

The potential level at the output node OUT10 increases the channel conductances of the n-channel enhancement type field effect transistors MN5 and MN6. The n-channel enhancement type field effect transistor MN5 pulls down the potential level at the current output node CN5, and, accordingly, the increases the channel conductances of the p-channel enhancement type field effect transistors MP9 and MP10. The p-channel enhancement type field effect transistor MP10 pulls up the potential level at the output node OUT11, and the p-channel enhancement type field effect transistor MP11 decreases the channel conductance. The p-channel enhancement type field effect transistor MP11 finally turns off.

The potential level at the output node OUT10 causes the n-channel enhancement type field effect transistor MN6 to turn on, and pulls down the potential level at the output node OUT12.

Thus, the output stage 12 swings the potential level at the output node OUT12 between a high level lower than the high potential level on the power supply line LH by the source-to-drain voltage of the p-channel enhancement type field effect transistor MP11 and a low level higher than the low potential level on the power supply line LL by the source-to-drain voltage of the n-channel enhancement type field effect transistor MN6.

As described in conjunction with the error compensable level-shift stage 11, even if the channel doping level of the n-channel enhancement type field effect transistor MN5 fluctuates in the fabrication process, the fluctuation does not affect the quiescent current, and the output stage 12 maintains the quiescent current at the target value. Moreover, the input stage 10 widely swings the potential level at the output node OUT10 in dependent on the input potential difference, and the error compensable level-shift stage 11 causes the output stage 12 to widely swing the potential level at the output node OUT12.

The circuit components of the first embodiment are corresponding to the claim languages as follows. The n-channel enhancement type field effect transistor MN5 serves as an inverting transistor, and the p-channel enhancement type field effect transistors MP9 and MP10 are corresponding to first and second current mirror transistors. The p-channel enhancement type field effect transistor MP11 and the n-channel enhancement type field effect transistor MN6 serve as a first output transistor and a second output transistor, respectively.

Second Embodiment

Figure 3:
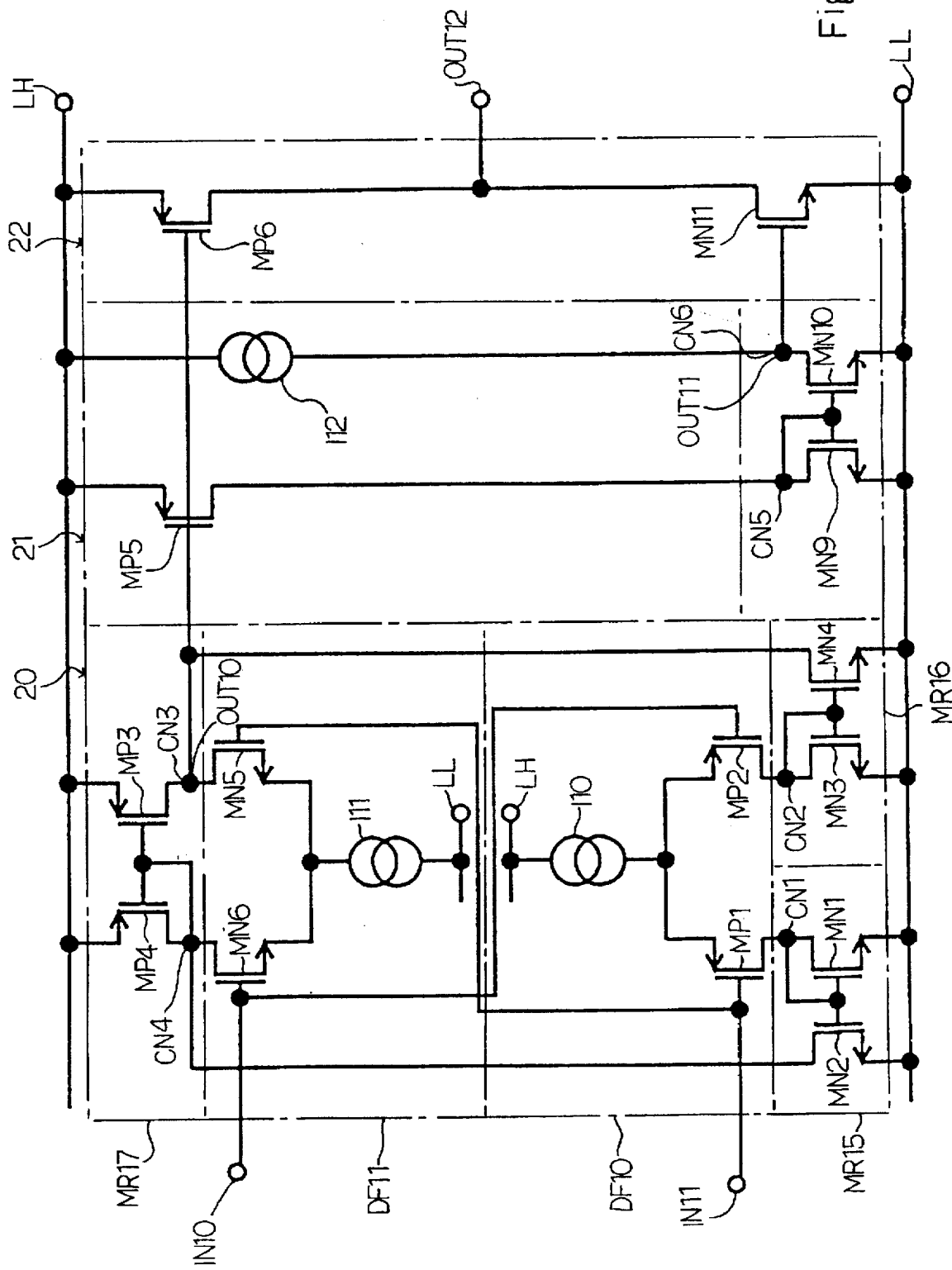
FIG. 3 is a circuit diagram showing the arrangement of a second operational amplifier circuit according to the present invention.

Turning to FIG. 3 of the drawings, another operational amplifier circuit embodying the present invention also largely comprises an input stage 20, an error compensable level-shift stage 21 and an output stage 22. The input stage 20, the error compensable level-shift stage 21 and the output stage 22 are coupled between the power voltage lines LH and LL, and the pair of input nodes IN10/IN11 and the output node OUT12 are respectively coupled to the input stage 20 and the output stage 22.

The input stage 20 includes a first differential circuit DF11, a second differential circuit DF12 and first to third current mirror circuits MR15, MR16 and MR17. Although the first and second differential circuits DF11 and DF12 and the first to third current mirror circuits MR15 to MR17 are similar in circuit configuration to the first and second differential circuits DF1 and DF2 and the first to third current mirror circuits MR10, MR11 and MR12 of the first embodiment, the channel conductivity types of the component transistors are opposite to those of the first and second differential circuits DF1 and DF2 and the first to third current mirror circuits MR10, MR11 and MR12, and the currents flow from the third current mirror circuit and the first differential circuit DF10 through the second differential circuit DF11 and the first and second current mirror circuits MR15 and MR16. For this reason, the circuit components of the input stage 20 are labeled with like references designating those circuit components of the input stage 10 and exchanging the indications of the channel conductivity types "P" and "N" with each other.

The error compensable level-shift stage 21 is also similar in circuit configuration to the error compensable level-shift stage 11 of the first embodiment. However, the component transistors of the error compensable level-shift stage 21 are only different in channel conductivity types to those of the error compensable level-shift stage 21. For this reason, the circuit components of the error compensable level-shift stage 21 are labeled with like references designating those circuit components of the error compensable level-shift stage 11 and exchanging the indications of the channel conductivity types "P" and "N" with each other.

The output stage 22 is similar in circuit configuration to the output stage 12, and the circuit components of the output stage 22 are labeled with like references of the output stage 12 and exchanging the indications of the channel conductivity types "P" and "N" with one another.

Thus, the operational amplifier circuit is fabricated from the circuit component exchanging the channel conductivity types with one another, and achieves all the advantages of the first embodiment.

Third Embodiment

Figure 4:
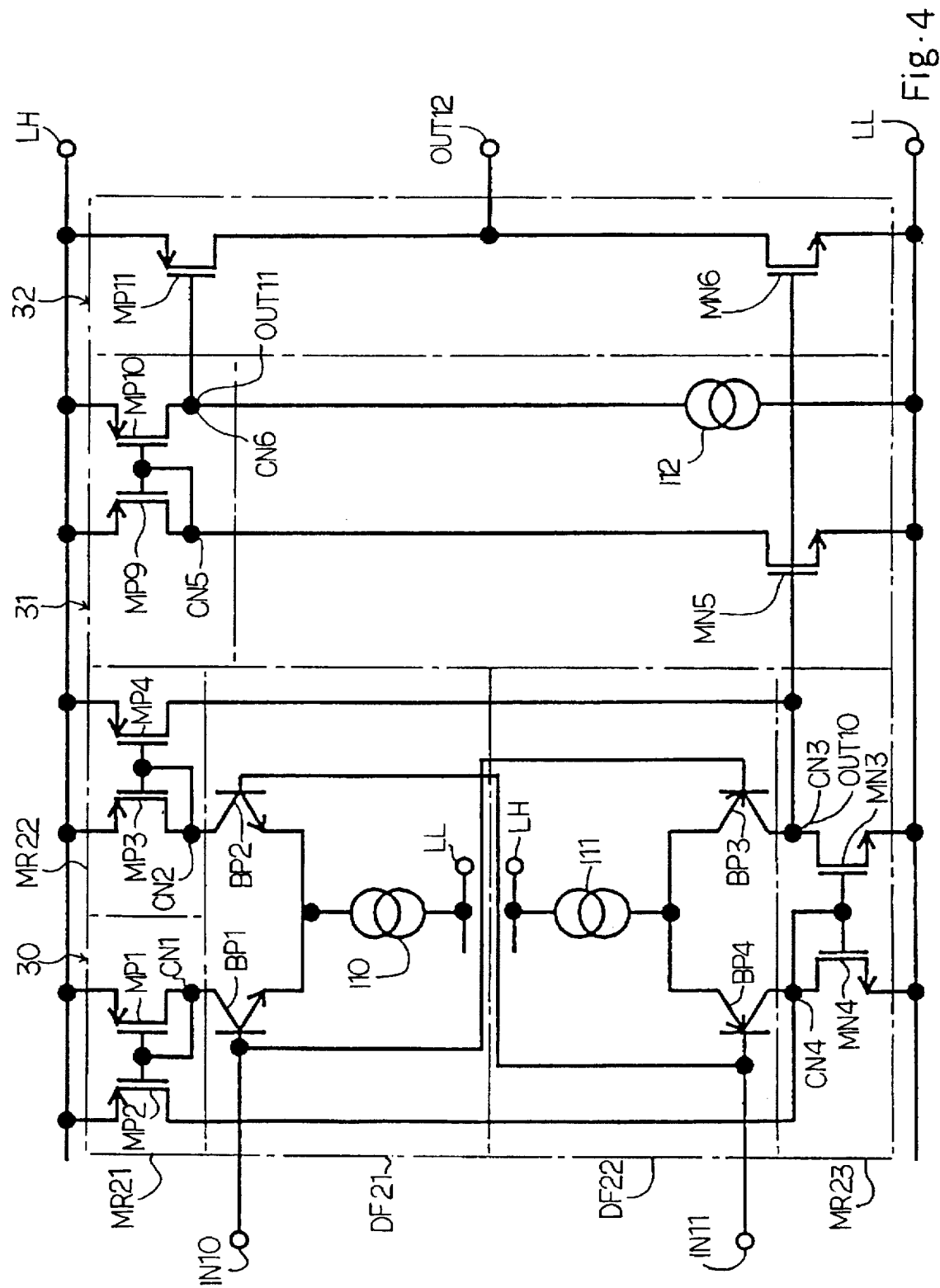
FIG. 4 is a circuit diagram showing the arrangement of a third operational amplifier circuit according to the present invention.

Turning to FIG. 4 of the drawings, yet another operational amplifier circuit embodying the present invention also largely comprises an input stage 30, an error compensable level-shift stage 31 and an output stage 32. The input stage 30, the error compensable level-shift stage 31 and the output stage 32 are coupled between the power voltage lines LH and LL, and the pair of input nodes IN10/IN11 and the output node OUT12 are respectively coupled to the input stage 30 and the output stage 32.

The input stage 30 includes a first differential circuit DF21, a second differential circuit DF12 and first to third current mirror circuits MR21, MR22 and MR23. The first to third current mirror circuits MR21 to MR23 are similar to the first to third current mirror circuits MR10 to MR12, and the circuit components of the first to third current mirror circuits MR21 to MR23 are labeled with the same references as those designating the corresponding circuit components of the first to third current mirror circuits MR10 to MR12.

The n-channel enhancement type field effect transistors MN1 and MN2 of the first differential circuit DF1 are replaced with n-p-n type bipolar transistors BP1 and BP2 for the first differential stage DF21, and the p-channel enhancement type field effect transistors MP5 and MP6 are replaced with p-n-p type bipolar transistors BP3 and BP4 for the second differential circuit DF22. In general, bipolar transistors are larger in mutual conductance. For this reason, the first and second differential circuits DF21 and DF22 are larger in gain than the first and second differential circuits DF1 and DF2 and, accordingly, higher in accuracy.

The error compensable level-shift stage 31 and the output stage 32 are similar in circuit configuration to those of the first embodiment, and the circuit components of the error compensable level-shift stage 31 and the circuit components of the output stage 32 are labeled with the same references as those designating the corresponding circuit components of the error compensable level-shift stage 11 and the corresponding circuit components of the output stage 12.

The operational amplifier circuit of the third embodiment achieve all the advantages of the first embodiment.

Fourth Embodiment

Figure 5:
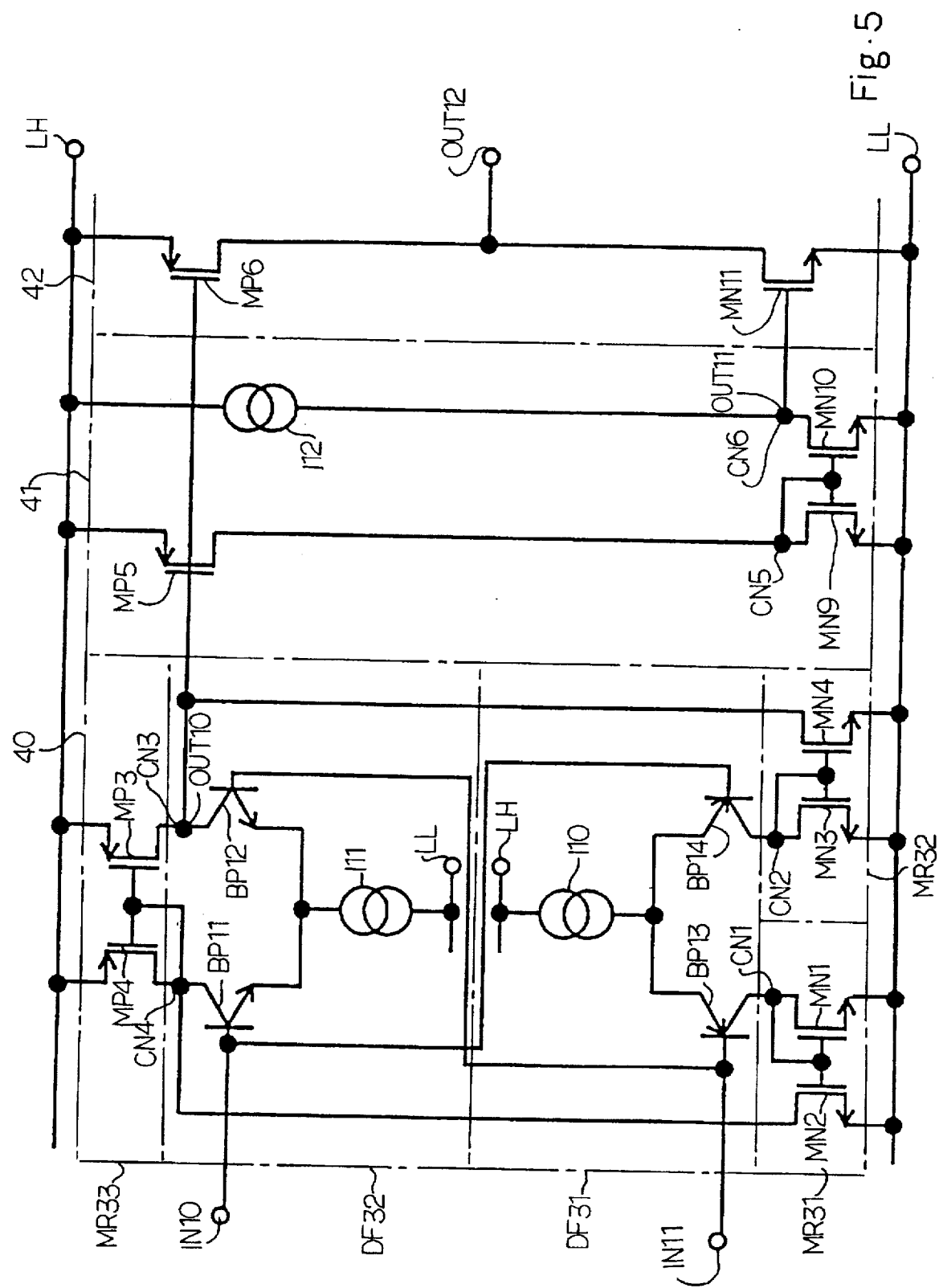
FIG. 5 is a circuit diagram showing the arrangement of a fourth operational amplifier circuit according to the present invention.

Turning to FIG. 5 of the drawings, still another operational amplifier circuit embodying the present invention largely comprises an input stage 40, an error-compensable level-shift stage 41 and an output stage 42. The input stage 40, the error compensable level-shift stage 41 and the output stage 42 are coupled between the power voltage lines LH and LL, and the pair of input nodes IN10/IN11 and the output node OUT12 are respectively coupled to the input stage 40 and the output stage 42.

The input stage 40 includes a first differential circuit DF31, a second differential circuit DF32 and first to third current mirror circuits MR31, MR32 and MR33. The first to third current mirror circuits MR31 to MR33 are similar to the first to third current mirror circuits MR15 to MR17 of the second embodiment, and the circuit components of the first to third current mirror circuits MR31 to MR33 are labeled with the same references as those designating the corresponding circuit components of the first to third current mirror circuits MR15 to MR17.

The n-channel enhancement type field effect transistors MN5 and MN6 of the first differential circuit DF11 are replaced with n-p-n type bipolar transistors BP11 and BP12 for the second differential stage DF32, and the p-channel enhancement type field effect transistors MP1 and MP2 are replaced with p-n-p type bipolar transistors BP13 and BP14 for the first differential circuit DF31.

The error compensable level-shift stage 41 and the output stage 42 are similar in circuit configuration to those of the second embodiment, and the circuit components of the error compensable level-shift stage 41 and the circuit components of the output stage 42 are labeled with the same references as those designating the corresponding circuit components of the error compensable level-shift stage 21 and the corresponding circuit components of the output stage 22.

The operational amplifier circuit of the third embodiment achieve all the advantages of the second embodiment and, accordingly, the first embodiment.

Fifth Embodiment

Figure 6:
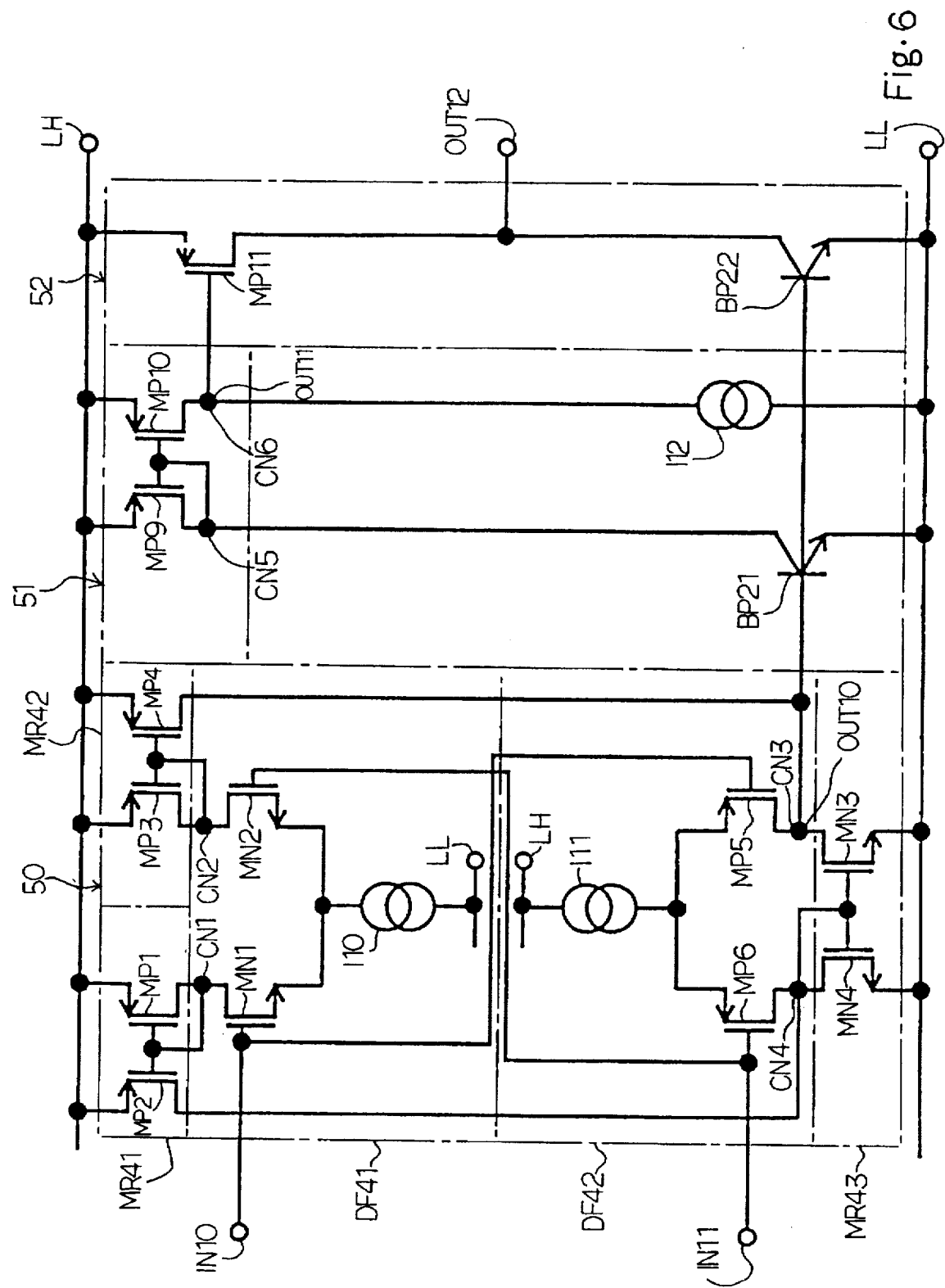
FIG. 6 is a circuit diagram showing the arrangement of a fifth operational amplifier circuit according to the present invention.

Turning to FIG. 6 of the drawings, an operational amplifier circuit embodying the present invention largely comprises an input stage 50, an error-compensable level-shift stage 51 and an output stage 52. The input stage 50, the error compensable level-shift stage 51 and the output stage 52 are coupled between the power voltage lines LH and LL, and the pair of input nodes IN10/IN11 and the output node OUT12 are respectively coupled to the input stage 50 and the output stage 52.

The input stage 50 includes a first differential circuit DF41, a second differential circuit DF42 and first to third current mirror circuits MR41, MR42 and MR43. The first and second differential circuits DF41/DF42 and the first to third current mirror circuits MR41 to MR43 are similar to the first and second differential circuits DF1/DF2 and the first to third current mirror circuits MR10 to MR12, and the circuit components of the first and second differential circuits DF41/DF42 and the circuit components of the first to third current mirror circuits MR41 to MR43 are labeled with the same references as those designating the corresponding first components of the first and second differential circuits DF1/DF2 and the corresponding circuit components of the first to third current mirror circuits MR10 to MR12.

The n-channel enhancement type field effect transistor MN5 is replaced with an n-p-n type bipolar transistor BP21 for the error compensable level-shift stage 51, and the n-channel enhancement type field effect transistor MN6 is replaced with an n-p-n type bipolar transistor BP22 for the output stage 52. However, the other circuit components are similar to those of the error compensable level-shift stage 11 and the output stage 12. For this reason, the other circuit components are labeled with the same references as those designating the corresponding circuit components of the error compensable level-shift stage 51 and the corresponding circuit components of the output stage 52.

The n-p-n type bipolar transistors BP21 and BP22 are larger in mutual conductance than the n-channel enhancement type field effect transistors MN5 and MN6, and the output potential signal at the output node OUT12 is shifted at higher speed than that of the first embodiment. The operational amplifier circuit shown in FIG. 6 achieves all the advantages of the first embodiment.

Sixth Embodiment

Figure 7:
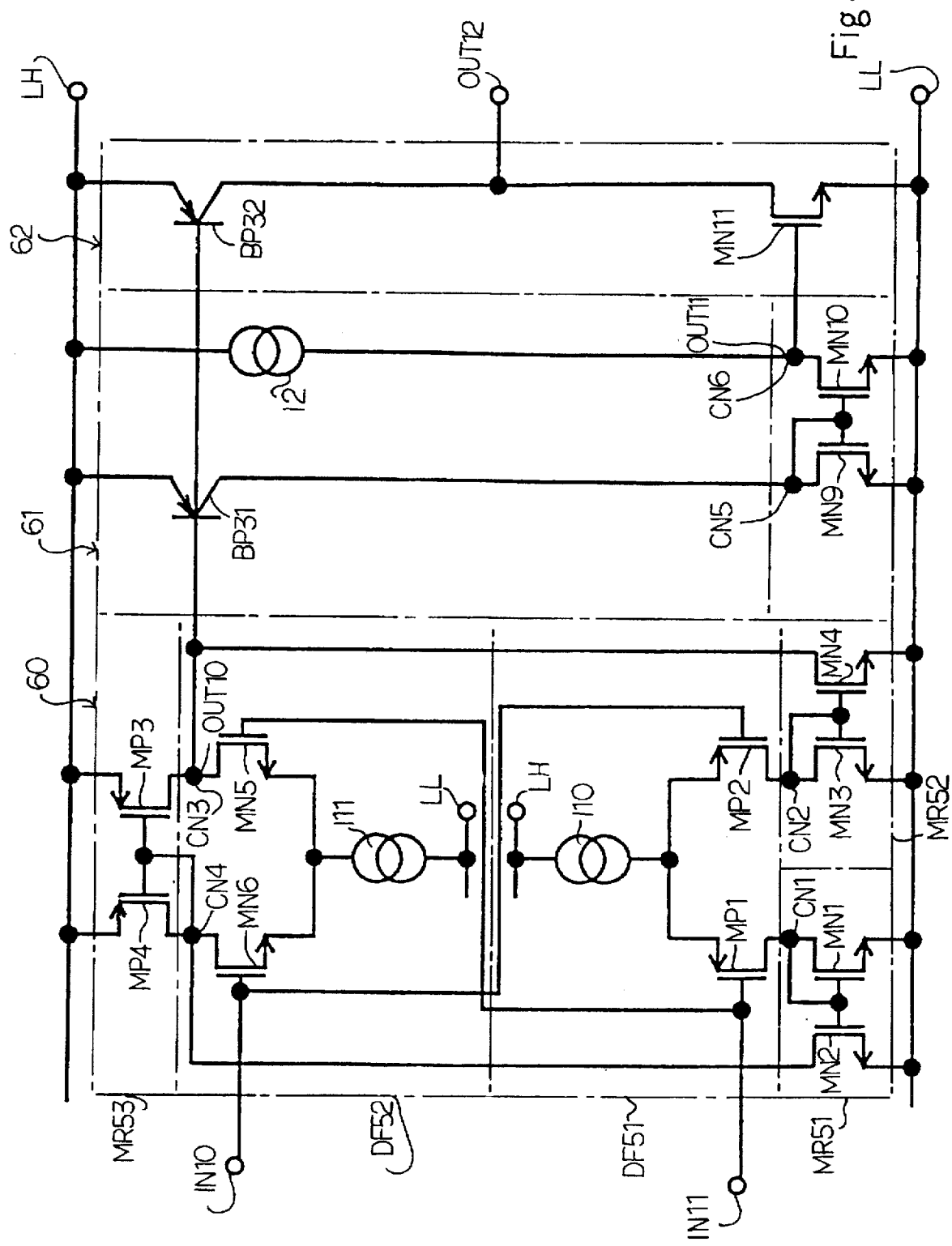
FIG. 7 is a circuit diagram showing the arrangement of a sixth operational amplifier circuit according to the present invention.

Turning to FIG. 7 of the drawings, an operational amplifier circuit embodying the present invention largely comprises an input stage 60, an error compensable level-shift stage 61 and an output stage 62. The input stage 60, the error compensable level-shift stage 61 and the output stage 62 are coupled between the power voltage lines LH and LL, and the pair of input nodes IN10/IN11 and the output node OUT12 are respectively coupled to the input stage 60 and the output stage 62.

The input stage 60 includes a first differential circuit DF51, a second differential circuit DF52 and first to third current mirror circuits MR51, MR52 and MR53. The first and second differential circuits DF51/DF52 and the first to third current mirror circuits MR51 to MR53 are similar to the first and second differential circuits DF10/DF11 and the first to third current mirror circuits MR15 to MR17, and the circuit components of the first and second differential circuits DF51/DF52 and the circuit components of the first to third current mirror circuits MR51 to MR53 are labeled with the same references as those designating the corresponding first components of the first and second differential circuits DF10/DF11 and the corresponding circuit components of the first to third current mirror circuits MR15 to MR17.

The p-channel enhancement type field effect transistor MP5 is replaced with a p-n-p type bipolar transistor BP31 for the error compensable level-shift stage 61, and the n-channel enhancement type field effect transistor MP6 is replaced with a p-n-p type bipolar transistor BP32 for the output stage 62. However, the other circuit components are similar to those of the error compensable level-shift stage 21 and the output stage 22. For this reason, the other circuit components are labeled with the same references as those designating the corresponding circuit components of the error compensable level-shift stage 21 and the corresponding circuit components of the output stage 22.

The p-n-p type bipolar transistors BP31 and BP32 are larger in mutual conductance than the p-channel enhancement type field effect transistors MP5 and MP6, and the output potential signal at the output node OUT12 is shifted at higher speed than that of the second embodiment. The operational amplifier circuit shown in FIG. 7 achieves all the advantages of the second embodiment.

Seventh Embodiment

Figure 8:
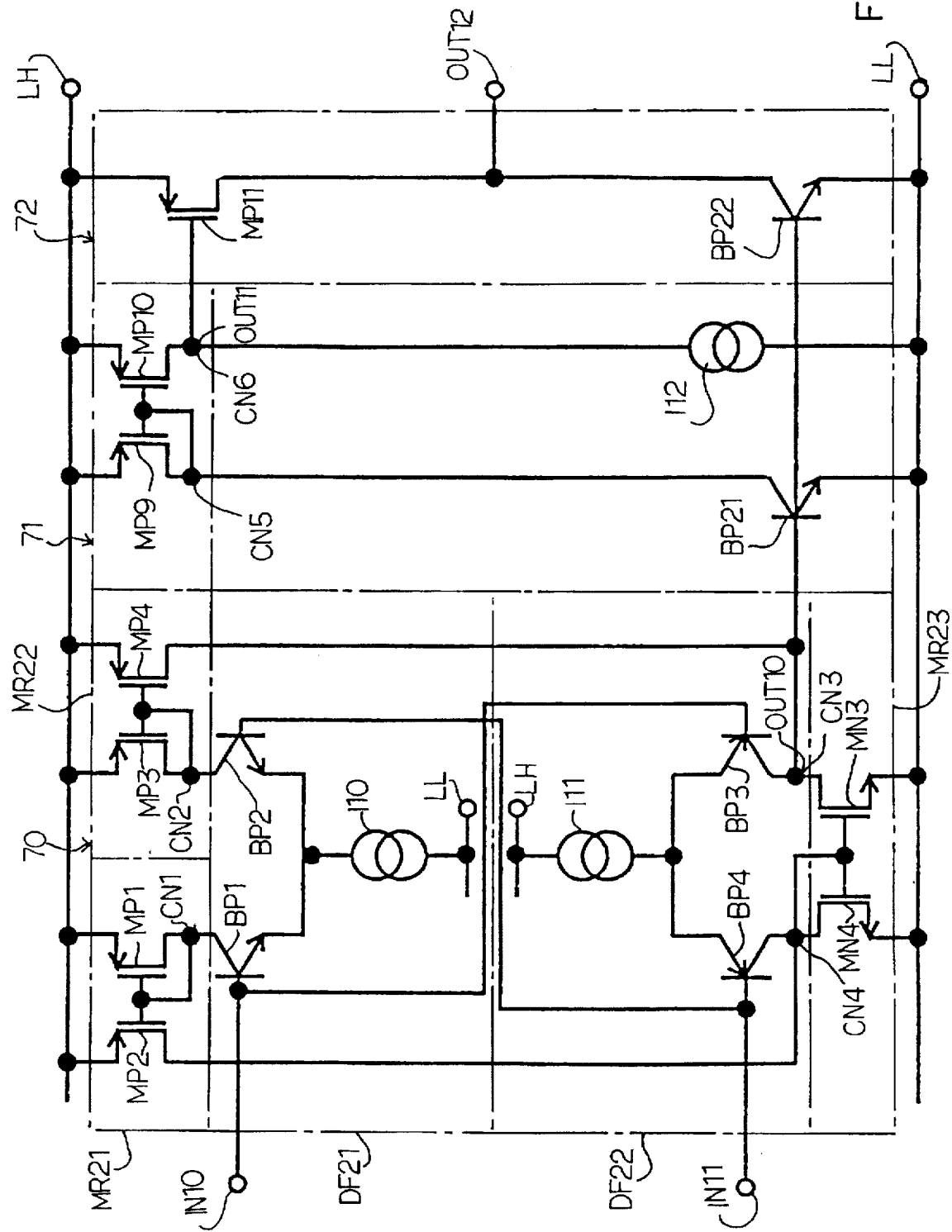
FIG. 8 is a circuit diagram showing the arrangement of a seventh operational amplifier circuit according to the present invention.

Turning to FIG. 8 of the drawings, an operational amplifier circuit embodying the present invention largely comprises an input stage 70, an error compensable level-shift stage 71 and an output stage 72. The input stage 70, the error compensable level-shift stage 71 and the output stage 72 are coupled between the power voltage lines LH and LL, and the pair of input nodes IN10/IN11 and the output node OUT12 are respectively coupled to the input stage 70 and the output stage 72.

The operational amplifier implementing the seventh embodiment is a compromise between the third embodiment and the fifth embodiment, and the input stage 70, the error compensable level-shift stage 71 and the output stage 72 are similar to the input stage 30, the error compensable level-shift stage 51 and the output stage 52. For this reason, the circuit components of the seventh embodiment are labeled with the same references as those designating the corresponding circuit components of the third and fifth embodiments.

The input stage 70 rapidly converts the input potential difference to the potential signal at the output node OUT10, and the error compensable level-shift stage 71 and the output stage 72 drives the potential signal at the output node OUT12 at high speed. The operational amplifier circuit implementing the seventh embodiment achieves all the advantages of the third and fifth embodiments.

Eighth Embodiment

Figure 9:
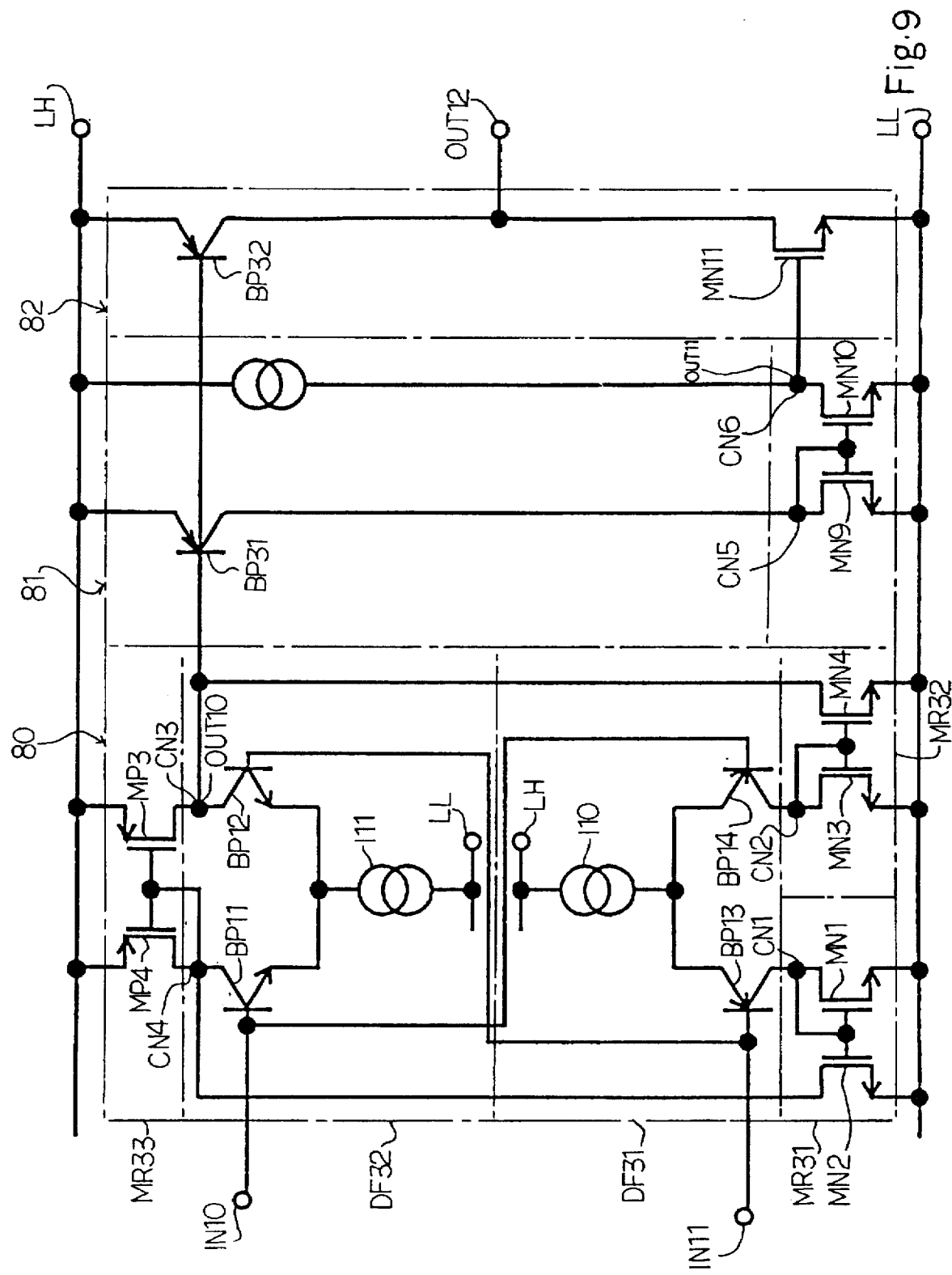
FIG. 9 is a circuit diagram showing the arrangement of an eighth operational amplifier circuit according to the present invention.

Turning to FIG. 9 of the drawings, an operational amplifier circuit embodying the present invention largely comprises an input stage 80, an error compensable level-shift stage 81 and an output stage 82. The input stage 80, the error compensable level-shift stage 81 and the output stage 82 are coupled between the power voltage lines LH and LL, and the pair of input nodes IN10/IN11 and the output node OUT12 are respectively coupled to the input stage 80 and the output stage 82.

The operational amplifier implementing the eighth embodiment is a compromise between the fourth embodiment and the sixth embodiment, and the input stage 80, the error compensable level-shift stage 81 and the output stage 82 are similar to the input stage 40, the error compensable level-shift stage 61 and the output stage 62. For this reason, the circuit components of the seventh embodiment are labeled with the same references as those designating the corresponding circuit components of the third and fifth embodiments.

The input stage 80 rapidly converts the input potential difference to the potential signal at the output node OUT10, and the error compensable level-shift stage 81 and the output stage 82 drives the potential signal at the output node OUT12 at high speed. The operational amplifier circuit implementing the eighth embodiment achieves all the advantages of the third and fifth embodiments.

Although particular embodiments of the present invention have been shown and described, it will be obvious to those skilled in the art that various changes and modifications may be made without departing from the spirit and scope of the present invention.

What is claimed is:

1. An operational amplifier circuit comprising:
   an input stage connected to first and second input nodes, and producing a first potential level variable with the magnitude of an input potential difference between said first and second input nodes at a first output node thereof;
   an error compensable level-shift stage including
      an inverting transistor having a control node coupled to said first output node of said input stage for producing a second potential level complementarily varied with said first potential level at an intermediate node thereof,
      a first current mirror circuit having a first current mirror transistor coupled in series to said inverting transistor and a second current mirror transistor coupled in parallel to said first current mirror transistor, said first and second current mirror transistors having respective control nodes coupled to said intermediate node for producing a third potential level at a second output node thereof, a first constant current source coupled through said second output node to said second current mirror transistor; and an output stage including a first output transistor coupled to a first power voltage source and having a control node coupled to said second output node for varying an on-resistance thereof, a second output transistor coupled between said first output transistor and a second power voltage source different in power voltage level from said first power voltage source and having a control node coupled to said first output node for complementarily changing an on-resistance with respect to said on-resistance of said first output transistor, and a third output node provided between said first output transistor and said second output transistor for producing an output potential signal corresponding to said input potential difference.

2. An operational amplifier circuit comprising:

an input stage connected to first and second input nodes, and producing a first potential level variable with the magnitude of an input potential difference between said first and second input nodes at a first output node thereof;

an error compensable level-shift stage including an inverting transistor having a control node coupled to said first output node of said input stage for producing a second potential level complementarily varied with said first potential level at an intermediate node thereof, a first current mirror circuit having a first current mirror transistor coupled in series to said inverting transistor and a second current mirror transistor coupled in parallel to said first current mirror transistor, said first and second current mirror transistors having respective control nodes coupled to said intermediate node for producing a third potential level at a second output node thereof, a first constant current source coupled through said second output node to said second current mirror transistor; and an output stage including a first output transistor coupled to a first power voltage source and having a control node coupled to said second output node for varying an on-resistance thereof, a second output transistor coupled between said first output transistor and a second power voltage source different in power voltage level from said first power voltage source and having a control node coupled to said first output node for complementarily changing an on-resistance with respect to said on-resistance of said first output transistor, and a third output node provided between said first output transistor and said second output transistor for producing an output potential signal corresponding to said input potential difference;

wherein the input stage includes a first differential circuit having a second constant current source coupled to said second power voltage source and first and second differential transistors coupled in parallel between first and second current nodes and said second constant current source and responsive to said input potential difference for complementarily changing fourth and fifth potential levels at said first and second current nodes, a second differential circuit having a third constant current source coupled to said first power voltage source and third and fourth differential transistors coupled between said third constant current source and third and fourth current nodes and responsive to said input potential difference for complementarily changing sixth and seventh potential levels at said third and fourth current nodes, said third current nodes being coupled to said first output node, a second current mirror circuit having third and fourth current mirror transistors coupled in parallel between said first power voltage source and said first and fourth current nodes and responsive to said fourth potential level so as to concurrently change the amounts of first and second currents passing through said first and fourth current nodes, a third current mirror circuit having fifth and sixth current mirror transistors coupled in parallel between said first power voltage source and said second and third current nodes and responsive to said fifth potential level so as to concurrently change the amounts of third and fourth currents passing through said second and third current nodes, and a fourth current mirror circuit having seventh and eighth current mirror transistors coupled between said third and fourth current nodes and said second power voltage source and responsive to said sixth potential level so as to concurrently change the amounts of fifth and sixth currents passing through said third and fourth current nodes, said fourth current mirror circuit increasing and decreasing said fifth and sixth currents when said second current mirror circuit increases and decreases said first and second current.

3. The operational amplifier circuit as set forth in claim 2, in which said first to fourth differential transistors, said first to eighth current mirror transistors, said first and second output transistors and said inverting transistor are enhancement type field effect transistors.

4. The operational amplifier circuit as set forth in claim 3, in which said first and second differential transistors, said seventh and eighth current mirror transistors, said inverting transistor and said second output transistor are an n-channel type, and said third and fourth differential transistors, said first to sixth current mirror transistors and said first output transistor are a p-channel type.

5. The operational amplifier circuit as set forth in claim 3, in which said first and second differential transistors, said seventh and eighth current mirror transistors, said inverting transistor and said second output transistor are a p-channel type, and said third and fourth differential transistors, said first to sixth current mirror transistors and said first output transistor are an n-channel type.

6. The operational amplifier circuit as set forth in claim 2, in which said first and second differential transistors and said third and fourth differential transistors are respectively first bipolar transistors and second bipolar transistors different in conductivity type of a base region from said first bipolar transistors, and said first to eighth current mirror transistors, said inverting transistor and said first and second output transistors are enhancement type field effect transistors.

7. The operational amplifier circuit as set forth in claim 6, in which said first bipolar transistors and said second bipolar transistors are an n-p-n type and a p-n-p type, respectively, said first to sixth current mirror transistors and said first output transistor are a p-channel type, and said seventh and eight current mirror transistors, said inverting transistor and said second output transistor are an n-channel type.

8. The operational amplifier circuit as set forth in claim 6, in which said first bipolar transistors and said second bipolar transistors are a p-n-p type and an n-p-n type, respectively, said first to sixth current mirror transistors and said first output transistor are an n-channel type, and said seventh and eight current mirror transistors, said inverting transistor and said second output transistor are a p-channel type.

9. The operational amplifier circuit as set forth in claim 2, in which said first to fourth differential transistors, said first to eighth current mirror transistors and said first output transistor are enhancement type field effect transistors, respectively, and said inverting transistor and said second output transistor are bipolar transistors, respectively.

10. The operational amplifier circuit as set forth in claim 9, in which said first to sixth current mirror transistors, said third and fourth differential transistors and said first output transistor are a p-channel type, said first and second differential transistors and said seventh and eighth current mirror transistors are an n-channel type, and said inverting transistor and said second output transistor are an n-p-n type.

11. The operational amplifier circuit as set forth in claim 9, in which said first to sixth current mirror transistors, said third and fourth differential transistors and said first output transistor are an n-channel type, said first and second differential transistors and said seventh and eighth current mirror transistors are a p-channel type, and said inverting transistor and said second output transistor are a p-n-p type.

12. The operational amplifier circuit as set forth in claim 2, in which said first to fourth differential transistors, said inverting transistor and said second output transistor are bipolar transistors, respectively, and said first to eighth current mirror transistors and said first output transistor are enhancement type field effect transistors, respectively.

13. The operational amplifier circuit as set forth in claim 12, in which said first and second differential transistors, said inverting transistor and said second output transistor are an n-p-n type, said third and fourth differential transistors are a p-n-p type, said first to sixth current mirror transistors and said first output transistor are a p-channel type, and said seventh and eighth current mirror transistors are an n-channel type.

14. The operational amplifier circuit as set forth in claim 12, in which said first and second differential transistors, said inverting transistor and said second output transistor are a p-n-p type, said third and fourth differential transistors are an n-p-n type, said first to sixth current mirror transistors and said first output transistor are an n-channel type, and said seventh and eighth current mirror transistors are a p-channel type.

* * * * *